United States Patent
Ikeda et al.

(10) Patent No.: US 9,285,204 B2
(45) Date of Patent: Mar. 15, 2016

(54) PASTE TRANSFER UNIT, ELECTRONIC COMPONENT MOUNTING DEVICE, AND TRANSFERRED FILM THICKNESS MEASURING METHOD

(71) Applicant: Panasonic Intellectual Property Management Co., Ltd., Osaka (JP)

(72) Inventors: Masanori Ikeda, Yamanashi (JP); Yousuke Hassaku, Yamanashi (JP); Satoshi Furuichi, Yamanashi (JP); Masahiro Taniguchi, Yamanashi (JP); Michinori Tomomatsu, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/655,593

(22) PCT Filed: Dec. 19, 2013

(86) PCT No.: PCT/JP2013/007477
§ 371 (c)(1),
(2) Date: Jun. 25, 2015

(87) PCT Pub. No.: WO2014/103262
PCT Pub. Date: Jul. 3, 2014

(65) Prior Publication Data
US 2015/0345930 A1 Dec. 3, 2015

(30) Foreign Application Priority Data

Dec. 27, 2012  (JP) ................................. 2012-284186

(51) Int. Cl.
*G01B 11/28* (2006.01)
*G01B 7/06* (2006.01)

(52) U.S. Cl.
CPC ....................................... *G01B 7/06* (2013.01)

(58) Field of Classification Search
CPC ........................................................ G01B 7/06
USPC ........................................................ 356/630
See application file for complete search history.

(56) References Cited

U.S. PATENT DOCUMENTS

2003/0193672 A1* 10/2003 Okada ................ G01B 11/0658
356/630
2010/0122455 A1* 5/2010 Noda ................ H01L 21/67144
29/832

FOREIGN PATENT DOCUMENTS

| JP | 2012-043904 A | 3/2012 |
| JP | 4908955 B2 | 4/2012 |
| JP | 5057409 B2 | 10/2012 |

OTHER PUBLICATIONS

International Search Report for Application No. PCT/JP2013/007477 dated Mar. 25, 2014.

*Primary Examiner* — Tarifur Chowdhury
*Assistant Examiner* — Omar Nixon
(74) *Attorney, Agent, or Firm* — Pearne & Gordon LLP

(57) ABSTRACT

To measure a film thickness of a coating film (25a) of a flux (25) serving as a bonding paste formed on a transfer stage (24) of a paste transfer unit (7), the film thickness of the coating film (25a) in a transfer area (26) is measured through a light-transmitting member (51) by a light interference method and by an optical type film thickness measuring sensor (53) which is arranged below the transfer stage (24). Thus, it is possible to automatically and accurately measure the film thickness of the flux (25) in the transfer area (26) without requiring any complicated measurement work.

6 Claims, 6 Drawing Sheets

(a)

SECTION TAKEN ALONG LINE A (b)

SECTION TAKEN ALONG LINE B

PASTE TRANSFER UNIT, ELECTRONIC COMPONENT MOUNTING DEVICE, AND TRANSFERRED FILM THICKNESS MEASURING METHOD

TECHNICAL FIELD

The present invention relates to a paste transfer unit, an electronic component mounting device and a transferred film thickness measuring method, which are used for transferring a bonding paste to an electronic component in the electronic component mounting device.

BACKGROUND ART

In solder bonding for bonding electronic components to a substrate through solder bumps of a semiconductor package etc., the solder bumps are landed on electrodes of the substrate in the state in which a bonding paste (hereinafter simply referred to as "paste") such as a flux or a soldering paste has been supplied to the solder bumps. In an electronic component mounting device for such electronic components to be mounted through solder bumps, a paste transfer unit for transferring a paste is disposed and the film thickness of a coating film formed on the paste transfer unit is required to be measured accurately in order to precisely adjust a transfer amount of the paste to each solder bump. Therefore, there has been disclosed a transfer unit using a system in which the film thickness can be measured automatically in place of a method which has been heretofore used to measure the film thickness by manual operation by means of a film thickness measuring jig (e.g. Patent Literature 1). In the conventional technique shown in the example of the Patent Literature, a film thickness measuring sensor is disposed above a peripheral position avoiding a transfer area to which a mounting head moves during transfer operation, so that the film thickness measuring sensor can be prevented from interfering with the mounting head which moves while holding electronic components in a space above the transfer unit.

CITATION LIST

Patent Literature

Patent Literature 1: JP-A-2012-043904

SUMMARY OF INVENTION

Technical Problem

However, in the background-art technique described in the aforementioned Patent Literature, the film thickness to be practically transferred in the transfer area is not a target to be measured. Due to this fact, there is a disadvantage as follows. That is, recently, due to a growing demand for halogen-free also in the electronic device industry from the viewpoint of environment protection, the kinds of additive components contained in the paste used for solder bonding have been limited. As a result, the viscosity of the paste to be transferred is lower than before.

Therefore, the paste formed into a film to be transferred may get out of shape easily due to sagging as time elapses. Thus, a difference is generated in the film thickness of the paste between the transfer area and its periphery. As a result, when a measurement result obtained from the film thickness measured in the periphery of the transfer area is used, an accurate measurement value of the practically required film thickness in the transfer area cannot be obtained. Thus, the bonding quality is made unstable due to a variation in the transfer amount of the paste transferred to each of the solder bumps. In this manner, there is a problem that it is difficult to automatically and accurately measure the film thickness of the paste in the transfer area without requiring any complicated measurement work in order to transfer the paste for use in the electronic component mounting device according to the background art.

Therefore, an object of the present invention is to provide a paste transfer unit, an electronic component mounting device and a transferred film thickness measuring method, in which the film thickness of a paste in a transfer area can be measured automatically and accurately without requiring any complicated measurement work.

Solution to Problem

A paste transfer unit according to an aspect of the present invention is used for transferring a light-transmissible bonding paste to a solder bump in an electronic component mounting device which mounts, on a substrate, an electronic component having a lower surface on which the solder bump is formed, the paste transfer unit including: a transfer stage to which the bonding paste is supplied and in which at least a part of a transfer area is made of a light-transmitting member, the transfer area being configured to transfer the bonding paste as a result of the solder bump moving; a squeegee which is arranged above the transfer stage to have a predetermined film-formation-gap from a coating film formation surface on the transfer stage and which moves relatively and horizontally to the transfer stage to thereby form the supplied bonding paste into a coating film with a predetermined film thickness; and an optical type film thickness measuring sensor which is arranged below the transfer stage and which measures the film thickness of the coating film in the transfer area through the light-transmitting member.

An electronic component mounting device according to an aspect of the present invention causes a mounting head to pick up an electronic component from a component feeding portion and carry and mount the electronic component onto a substrate, the electronic component having a lower surface on which a solder bump is formed, the electronic component mounting device including: a paste transfer unit which is used for transferring a light-transmissible bonding paste to the solder bump on the electronic component held by the mounting head; and a head moving unit which moves the mounting head to make the mounting head move toward the substrate and the paste transfer unit; wherein the paste transfer unit is the aforementioned paste transfer unit.

A transferred film thickness measuring method according to an aspect of the present invention measures a film thickness of a coating film of a light-transmissible bonding paste formed on a transfer stage of a paste transfer unit used for transferring the bonding paste to a solder bump in an electronic component mounting device which mounts on a substrate, an electronic component having a lower surface on which the solder bump is formed, wherein the film thickness of the coating film in a transfer area is measured through a light-transmitting member by an optical type film thickness measuring sensor which is arranged below the transfer stage, the light-transmitting member being formed in at least a part of the transfer area, the transfer area being configured to transfer the bonding paste as a result of the solder bump moving.

Advantageous Effects of Invention

According to the present invention, to measure a film thickness of a coating film of a bonding paste formed on a transfer stage of a paste transfer unit, the film thickness of the coating film in the transfer area is measured through a light-transmitting member by an optical type film thickness measuring sensor arranged below the transfer stage. Thus, the thickness of the film of the paste in the transfer area can be measured automatically and accurately without requiring any complicated measurement work.

DESCRIPTION OF EMBODIMENT

Figure 1:
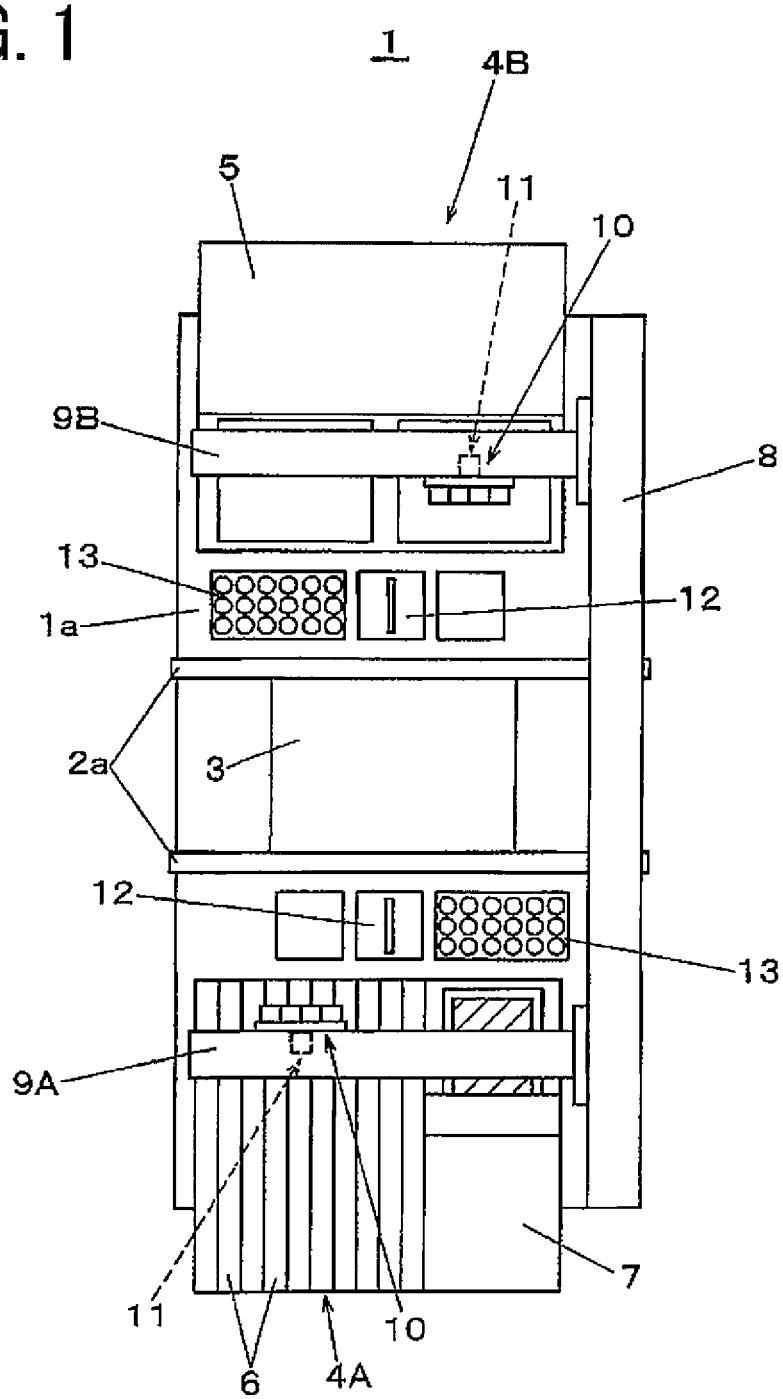
FIG. 1 is a plan view of an electronic component mounting device according to an embodiment of the present invention.

An embodiment of the present invention will be described below with reference to the drawings. First, the structure of an electronic component mounting device will be described with reference to FIG. 1 and FIG. 2. In FIG. 1, a substrate conveyance mechanism 2 is arranged in an X direction (substrate conveyance direction) on a base 1a of an electronic component mounting device 1. The substrate conveyance mechanism 2 conveys a substrate 3 as a target of a component mounting work. Component feeding portions which feed electronic components are arranged on both sides of the substrate conveyance mechanism 2. A plurality of kinds of electronic components including electronic components which include solder bumps formed in their lower surfaces are received in the component feeding portions.

A plurality of tape feeders 6 feeding electronic components held on tapes and a paste transfer unit 7 having mounting compatibility with other component feeders including the tape feeders 6 are mounted detachably in the component feeding portion 4A on one side so that the tape feeders 6 and the paste transfer unit 7 can be arranged in parallel with one another. A tray feeder 5 which feeds trays 5a receiving electronic components is set in the component feeding portion 4B on the other side.

The paste transfer unit 7 has a function of supplying a bonding paste such as a flux or a soldering paste in the state of a coating film to a coating film formation surface. The bonding paste is applied by transfer to electronic components held by a mounting head 10 which will be described later. Here, a light-transmissible flux to be applied by transfer to bumps for mounting the electronic components P (FIG. 2) including the bumps is a target to be transferred as the bonding paste.

A Y-axis table 8 is arranged in a Y direction in one X-direction end portion of the base 1a. The Y direction is perpendicular to the substrate conveyance mechanism 2. Two X-axis tables 9A and 9B are connected to the Y-axis table 8 so as to be movable in the Y direction. Mounting heads 10 are mounted on the X-axis table 9A and 9B respectively. When the X-axis table 9B and the Y-axis table 8 are driven, the corresponding mounting head 10 picks up electronic components P from one of the trays 5a held by the tray feeder 5 of the component feeding portion 4B, and carries and mounts the picked-up electronic components P onto the substrate 3 positioned and held by the substrate conveyance mechanism 2.

In addition, when the X-axis table 9A and the Y-axis table 8 are driven, the corresponding mounting head 10 picks up electronic components P from some of the tape feeders 6 of the component feeding portion 4A by nozzles 10a (see FIG. 2) mounted on a lower portion of the mounting head 10, and makes the picked-up electronic components P move to the paste transfer unit 7 for paste transfer. In addition, the corresponding mounting head 10 carries and mounts the electronic components P to which the paste has been transferred, onto the substrate 3 positioned and held by the substrate conveyance mechanism 2. Accordingly, the X-axis table 9A and the Y-axis table 8 constitute a head moving unit which moves the mounting head 10 to thereby make the mounting head 10 move toward the substrate 3 and the paste transfer unit 7.

The X-axis tables 9A and 9B are equipped with substrate recognizing cameras 11 which move integrally with the mounting heads 10 respectively. When one of the mounting heads 10 moves above the substrate 3, the corresponding substrate recognizing camera 11 also moves to capture an image of the substrate 3. A component recognizing camera 12 and a nozzle stocker 13 are arranged between each component feeding portion 4A, 4B and the substrate conveyance mechanism 2 in the base 1a.

The nozzle stocker 13 receives the nozzles 10a which can be mounted on the corresponding mounting head 10 for a plurality of component kinds. When the mounting head 10 is made to move to the nozzle stocker 13 and execute a predetermined nozzle exchange operation, the nozzles 10a in the mounting head 10 can be exchanged in accordance with the component kinds. The mounting head 10 having held electronic components P is relatively moved in the X direction above the component recognizing camera 12. In this manner, the component recognizing camera 12 can read an image of the electronic components P from below. As a result, the kind or shape of each of the electronic components P which are held by the mounting head 10 can be recognized. In the operation in which the electronic components P are mounted by the mounting head 10, mounting positions in the substrate 3 are corrected in consideration of the substrate recognition result made by the substrate recognizing camera 11 and the component recognition result made by the component recognizing camera 12.

Figure 2:
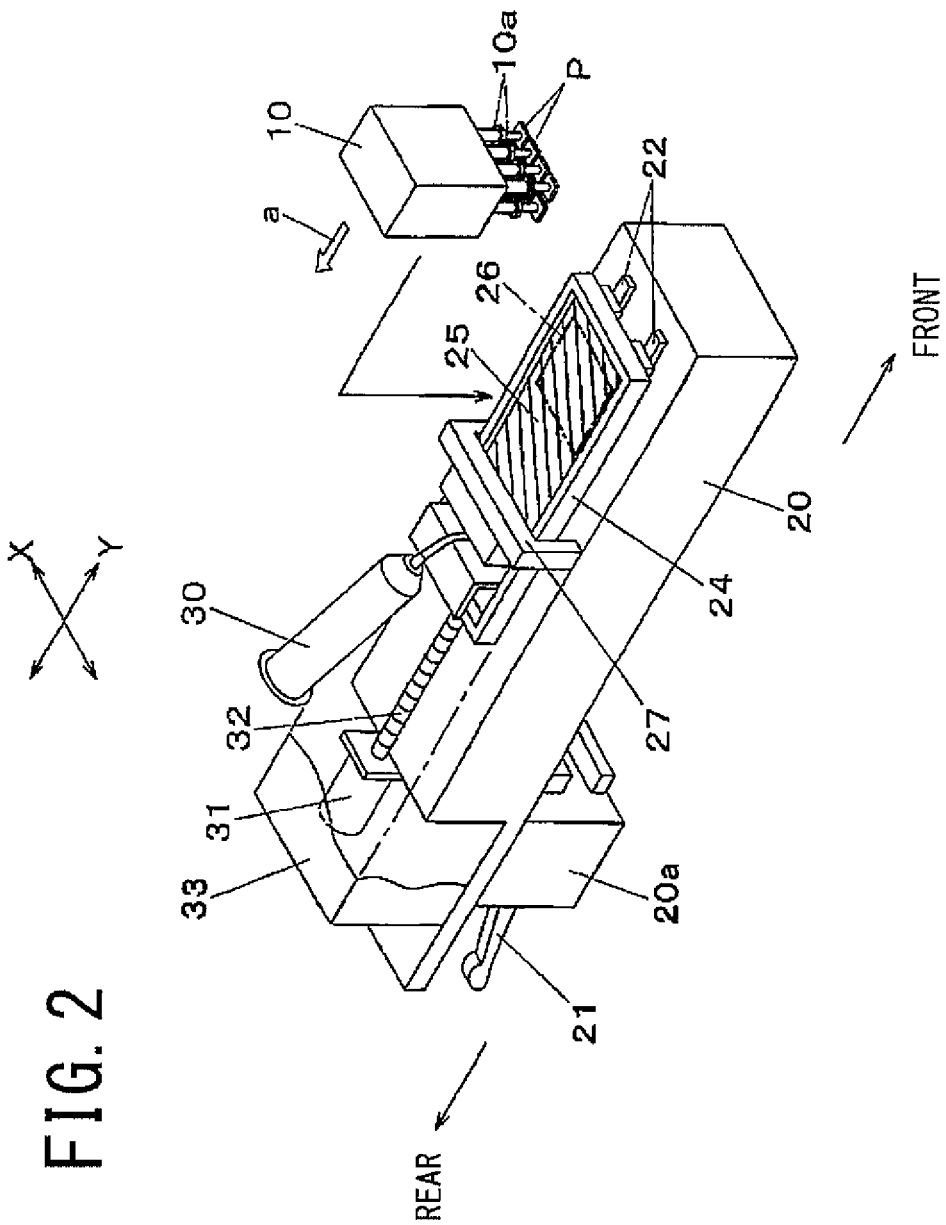
FIG. 2 is a perspective view of a paste transfer unit used in the electronic component mounting device according to the embodiment of the present invention.

Next, the structure of the paste transfer unit 7 will be described with reference to FIG. 2, FIG. 3, FIG. 4(a) and FIG. 4 (b). As shown in FIG. 2, the paste transfer unit 7 has a configuration in which respective portions which will be described below are provided in a base portion 20 having a long shape. The base portion 20 is mounted detachably from an opposite side of a moving direction (arrow a) of the mounting head 10 while the longitudinal direction of the base portion 20 is aligned with a feeder base 16 (see FIG. 3) in the Y direction. The feeder base 16 is provided in the component feeding portion 4A. In the description, the moving side where the mounting head 10 is moved toward the paste transfer unit 7 is defined as front side and the opposite direction to the moving side where the mounting head 10 is moved the paste transfer unit 7 is defined as rear side.

An engagement portion 20a which is engaged with the feeder base 16 so as to fix the base portion 20 to the feeder base 16 in the same manner as the other tape feeders 6 is provided in the paste transfer unit 7. Further, a handle 21 is provided to protrude rearward from the engagement portion 20a. To attach the paste transfer unit 7 to the feeder base 16, the handle 21 is pushed forward while being held in the state in which the lower surface side of the base portion 20 extends along the upper surface of the feeder base 16. In this manner, the engagement portion 20a is engaged with a rear end portion of the feeder base 16. Thus, the base portion 20 is mounted in a predetermined position.

Figure 3:
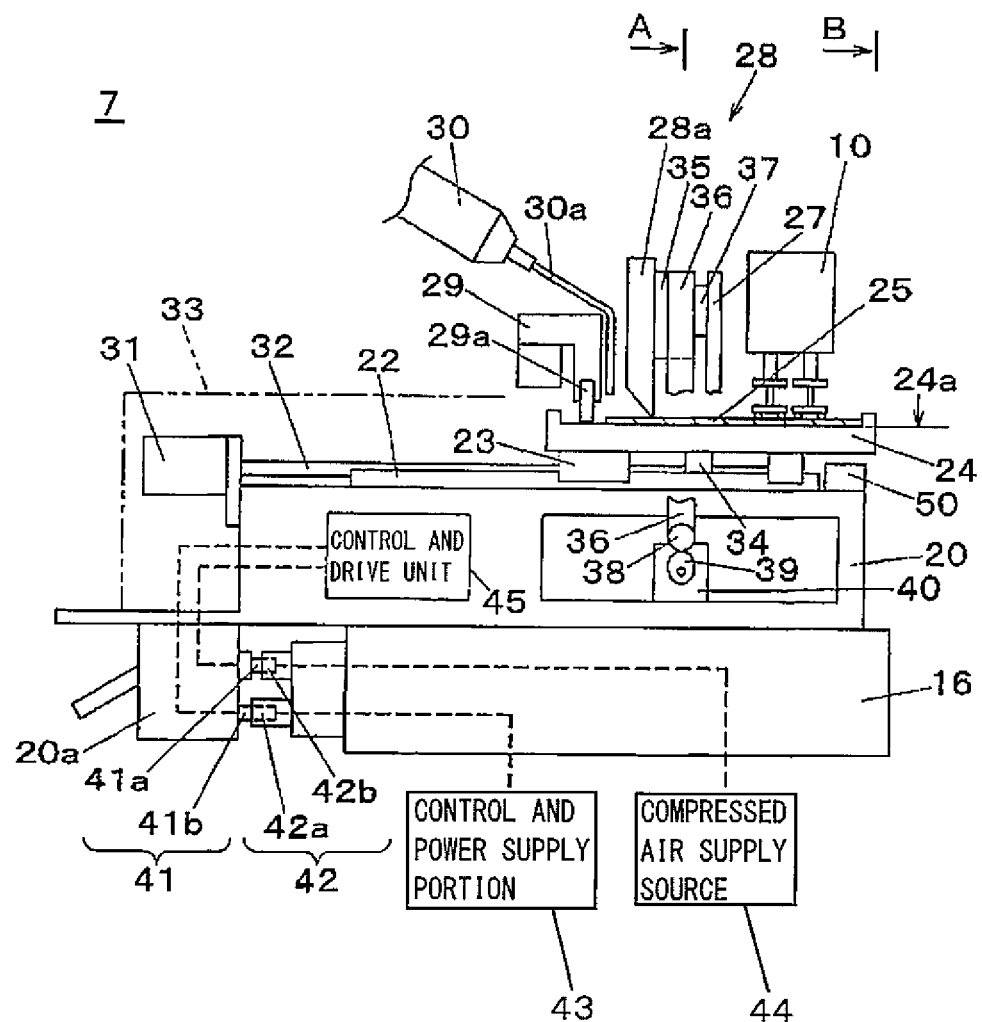
FIG. 3 is an explanatory view of the structure of the paste transfer unit used in the electronic component mounting device according to the embodiment of the present invention.
Figure 4:
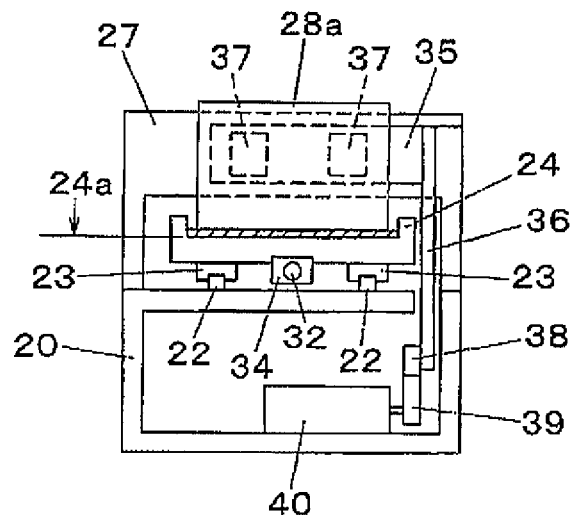
FIGS. 4 (a) and (b) are explanatory views of the structure of the paste transfer unit used in the electronic component mounting device according to the embodiment of the present invention.
Figure 4:
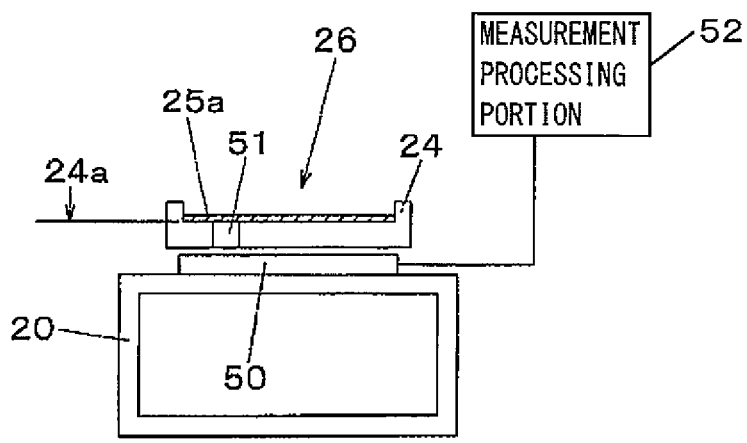

Guide rails 22 are arranged in the longitudinal direction on the upper surface of the base portion 20. Sliders 23 fitted to the guide rails 22 so as to be slidable thereon are firmly fixed to the lower surface of a transfer stage 24. A transfer area 26 is provided in the transfer stage 24 so that a flux 25 as a light-transmissible bonding paste can be supplied to the transfer area 26 while solder bumps of electronic components P can move to the transfer area 26. Thus, the flux 25 can be transferred to the solder bumps of the electronic components P in the transfer area 26. As shown in FIG. 3, a feed screw 32 is screwed to a nut 34 connected to the lower surface of the transfer stage 24. The feed screw 32 is driven and rotated by a motor 31 disposed on a rear end portion side of the base portion 20. Accordingly, when the motor 31 is driven, the transfer stage 24 moves back and forth in the longitudinal direction over the upper surface of the base portion 20.

That is, the guide rails 22, the sliders 23, the nut 34, the feed screw 32, and the motor 31 serve as a stage driving unit which can move the transfer stage 24 back and forth in the longitudinal direction with respect to the base portion 20. This stage driving unit is covered with a safety cover 33 in order to protect the safety of a worker. Here, the stage driving unit has a configuration in which the motor 31 as a drive source of the stage driving unit is disposed on the opposite side of the moving direction of the mounting head 10. In this manner, move of the mounting head 10 to the paste transfer unit 7 in a component mounting operation performed by the mounting head 10 can be prevented from being disturbed.

The transfer stage 24 has the structure of a rectangular member in which a recess having a smooth bottom is formed on its upper surface side. The bottom of the recess serves as a coating film formation surface 24a for forming a coating film of the flux 25 and transferring the coating film of the flux 25 to electronic components. The transfer area 26 where the coating film of the flux 25 is transferred to electronic components P held by the mounting head 10 is set in a front end portion of the coating film formation surface 24a. Here, the size of the transfer area 26 is set in such a manner that the flux 25 can be collectively transferred to a plurality of electronic components P held by a plurality of (eight in this case) nozzles 10a of the mounting head 10. On this occasion, the transfer stage 24 is shaped like a rectangle. Accordingly, the transfer area 26 can be set to be as large as possible with respect to the width of the transfer stage 24 so that the whole width of the paste transfer unit 7 can be made as small as possible.

A film formation squeegee unit 28 and a scraping unit 29 are disposed above the transfer stage 24, at the rear of the transfer area 26 and in positions not interfering with the mounting head 10. Further, a needle 30a of a paste supply cylinder 30 is inserted and disposed between the film formation squeegee unit 28 and the scraping unit 29. The paste supply cylinder 30 and the needle 30a supply the flux 25 to the transfer stage 24. The film formation squeegee unit 28 is held by a bracket 27 provided erectly on the base portion 20 so that the horizontal position of the film formation squeegee unit 28 can be fixed with respect to the base portion 20.

The detailed structure of the film formation squeegee unit 28 will be described with reference to FIG. 3, FIG. 4(a) and FIG. 4(b). FIG. 4(a) and FIG. 4(b) show a section taken along Line A and a section taken along Line B in FIG. 3 respectively. In FIG. 3, the film formation squeegee unit 28 is provided with a squeegee 28a which extends downward to have its lower end portion arranged at a predetermined film-formation-gap g (see FIG. 6(a)) from the coating film formation surface 24a. Accordingly, the squeegee 28a is connected to a connection member 35. The connection member 35 is mounted on the bracket 27 through slide units 37. The squeegee 28a can move up and down relatively to the bracket 27.

When the transfer stage 24 in the state in which the flux 25 has been supplied to the coating film formation surface 24a is relatively moved in the Y direction by the aforementioned stage driving unit, the squeegee 28a spreads the flux 25 which has been supplied to the coating film formation surface 24a, so as to form a coating film 25a with a predetermined film thickness corresponding to the film-formation-gap g. When the transfer stage 24 on which the film has been formed is moved to the side of the moving direction performed by the mounting head 10, the transfer area 26 (FIG. 2) where the coating film 25a of the flux 25 has been formed can be positioned in a position where a paste transfer operation will be performed by the mounting head 10, as shown in FIG. 3.

A film thickness measuring unit 50 is arranged on the upper surface of a front end portion of the base portion 20 and located below the transfer area 26 in the state in which the transfer stage 24 has moved to the front. As shown in FIG. 4(b), the film thickness measuring unit 50 is located below a light-transmitting member 51 such as glass provided within the range of the transfer area 26 in the transfer stage 24. The film thickness measuring unit 50 is connected to a measurement processing portion 52. The film thickness measuring unit 50 has a function of optically measuring the film thickness of the coating film 25a which has been formed on the coating film formation surface 24a in the transfer area 26 through the light-transmitting member 51.

Figure 5:
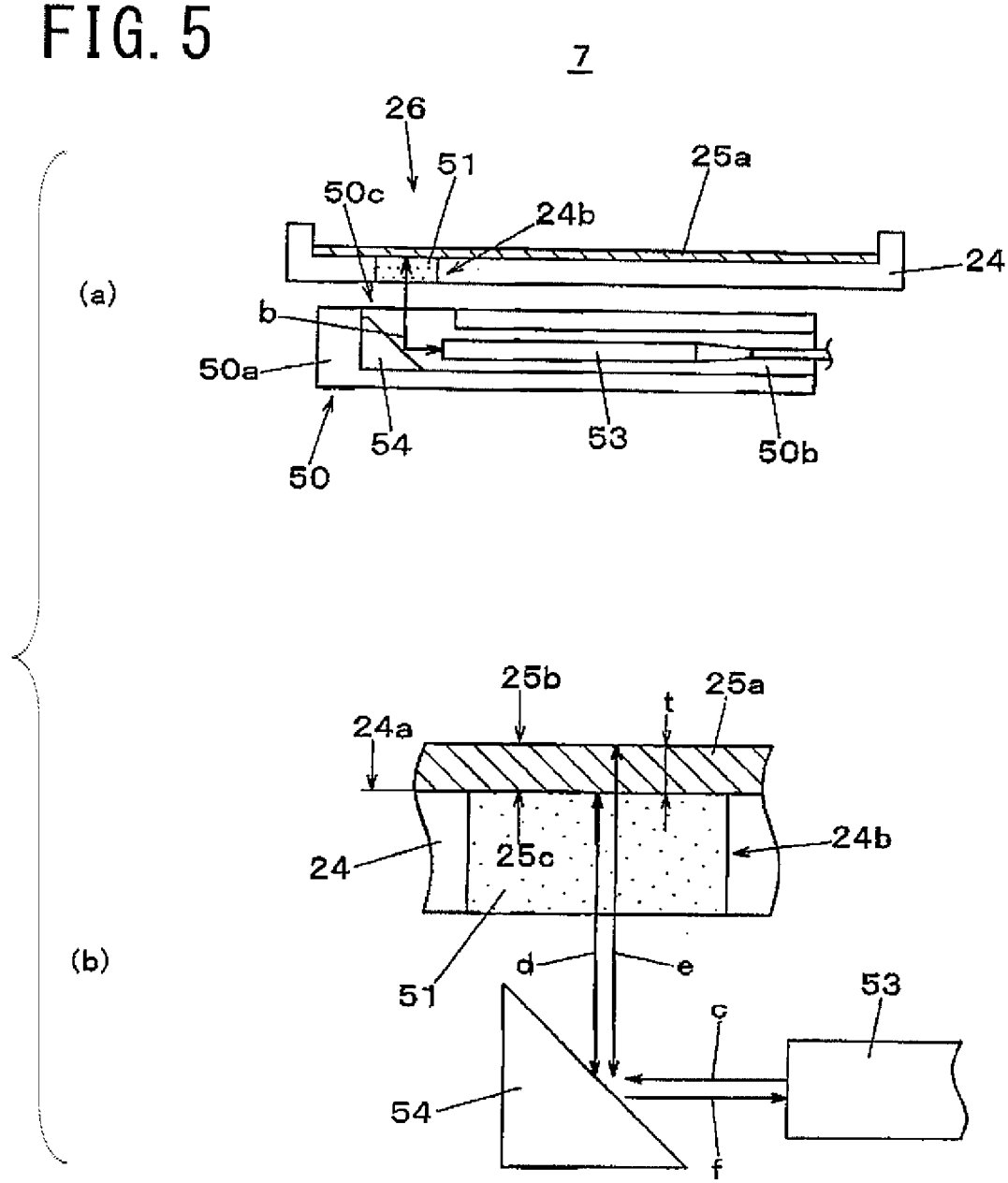
FIGS. 5 (a) and (b) are explanatory views of operation of the paste transfer unit according to the embodiment of the present invention.

The configuration and function of the film thickness measuring unit 50 will be described with reference to FIG. 5 (a) and FIG. 5(b). As shown in FIG. 5(a), the film thickness measuring unit 50 has a configuration in which an optical type film thickness measuring sensor 53 and an optical prism 54 are received inside a rectangular sensor block 50a disposed horizontally. The optical type film thickness measuring sensor 53 serves as a spectral interference type displacement sensor which is inserted into a reception hole 50b provided longitudinally in the sensor block 50a.

A measurement opening 50c is formed in a front end portion of the sensor block 50a and located below the light-transmitting member 51 mounted in a mounting hole 24b of the transfer stage 24. The optical prism 54 is mounted below the measurement opening 50c. To measure the film thickness, inspection light (arrow b) of a broad wavelength band radiated from a sensor head of the optical type film thickness measuring sensor 53 is reflected upward by the optical prism 54. The reflected light of the inspection light entering the flux 25 from below through the light-transmitting member 51 is received by the optical type film thickness measuring sensor 53 so that the film thickness of the flux 25 can be obtained.

That is, as shown in FIG. 5(b), inspection light (arrow c) radiated from the optical type film thickness measuring sensor 53 enters the light-transmitting member 51 through the optical prism 54 and is further reflected by a lower surface 25c and an upper surface 25b of a coating film 25a (arrows d and e). These reflected lights are received by the optical type film thickness measuring sensor 53 through the optical prism 54

(arrow f). Signals of these received lights are transmitted to the measurement processing portion 52 (FIG. 4(b)) so that a film thickness t of the coating film 25a on the light-transmitting member 51 can be obtained based on the intensity of coherent light of these reflected lights.

In order to obtain an accurate measurement result in the film thickness measurement based on the aforementioned spectral interference method, the material used for the light-transmitting member 51 is required to have an optical characteristic with a higher light refractive index than that of the light-transmissible flux 25 which is typically used. For example, it is desirable that a material having a refractive index not smaller than 1.7 is used as the light-transmitting member 51.

The portion where the light-transmitting member 51 is formed in the transfer stage 24 can be set suitably as long as the film thickness within the transfer area 26 can be measured in the portion. For example, the light-transmitting member 51 may be mounted in a rectangular range set within the transfer area 26 in the coating film formation surface 24a or the light-transmitting member 51 may be formed as spots in the transfer area 26. In brief, it might be sufficient that the light-transmitting member 51 is formed in at least a part where film thickness measurement is required in the transfer area 26.

In addition, an example in which the film thickness is measured through the optical prism 54 arranged below the light-transmitting member 51 has been shown as the method for arranging the optical type film thickness sensor 53 in the aforementioned embodiment. In some layout of components in the paste transfer unit 7, however, the optical type film thickness measuring sensor 53 may be arranged without using the optical prism 54. For example, the optical type film thickness measuring sensor 53 may be set in an upright posture so that inspection light can enter the light-transmitting member 51 directly. Further, an example in which the optical type film thickness measuring sensor 53 is arranged fixedly but separately from the transfer stage 24 which can move horizontally has been shown in the embodiment. However, the optical type film thickness measuring sensor 53 may have a configuration in which the optical type film thickness measuring sensor 53 is provided integrally with the lower surface of the transfer stage 24 to be always able to measure the film thickness.

In FIG. 3, the scraping unit 29 is provided with a scraper 29a extending downward. The scraper 29a is urged downward to be always brought into abutment against the coating film formation surface 24a in spite of the height position of the transfer stage 24. When the transfer stage 24 is moved back and forth in the Y direction by the stage driving unit, the scraper 29a scrapes the flux 25 on the transfer stage 24.

An elevating member 36 arranged in an up and down direction is connected to the connection member 35. A cam follower 38 is connected to a lower end portion of the elevating member 36 which penetrates the inside of the base portion 20. A motor 40 is arranged in a horizontal posture inside the base portion 20. A circular plate cam 39 connected to a rotary shaft of the motor 40 abuts against the cam follower 38. When the motor 40 is driven and rotated in this state, the elevating member 36 moves up and down in accordance with the cam characteristic of the circular plate cam 39. Accordingly, the squeegee 28a moves up and down relatively to the coating film formation surface 24a.

That is, the elevating member 36, the cam follower 38, the circular plate cam 39 and the motor 40 serve as a squeegee position adjusting unit which adjusts the position of the squeegee 28a in the up and down direction. In a film formation operation which will be described later, the position of the squeegee 28a can be adjusted in the up and down direction so that the film-formation-gap g between the lower end portion of the squeegee 28a and the coating film formation surface 24a can be changed. Accordingly, the thickness of the coating film of the flux 25 in the coating film formation surface 24a can be changed. Although a cam mechanism in which the cam follower 38 and the circular plate cam 39 are combined with each other is used as the squeegee position adjusting unit here, any other drive system than the cam mechanism may be used as long as the drive system is a linear motion mechanism which can move the elevating member 36 up and down desirably.

As shown in FIG. 3, an air coupler 41a and an electric connector 41b constituting a unit side connection portion 41 are provided in the engagement portion 20a provided on the lower surface side of the base portion 20. The air coupler 41a and the electric connector 41b are connected to a control and drive unit 45 built in the paste transfer unit 7 by air piping and electric wiring respectively. The control and drive unit 45 has a function of controlling and driving the motor 31 as the drive source of the stage driving unit or the motor 40 as the drive source of the film formation squeegee unit 28, supplying or controlling compressed air for discharging the flux 25 from the paste supply cylinder 30, further controlling the film thickness measuring unit 50 and the measurement processing portion 52 to measure the transferred film thickness of the flux 25 in the coating film formation surface 24a, and controlling the squeegee position adjusting unit based on the measurement result to adjust the film-formation-gap g. Accordingly, the control and drive unit 45 serves as a gap adjusting portion which adjusts the film-formation-gap g based on the measurement result of the film thickness measured by the optical type film thickness measuring sensor 53.

A base side connection portion 42 constituted by an air coupler 42a and an electric connector 42b is provided in the rear end portion of the feeder base 16. The air coupler 42a and the electric connector 42b are connected to a control and power supply portion 43 and a compressed air supply source 44 by air piping and electric wiring respectively. When the paste transfer unit 7 is slid forward along the feeder base 16 and mounted, the unit side connection portion 41 is fitted to the base side connection portion 42. In this manner, the control and power supply portion 43 is electrically connected to the control and drive unit 45. Further, compressed air can be supplied from the compressed air supply source 44 to the control and drive unit 45. When the paste transfer unit 7 is slid rearward, connection of the control and drive unit 45 with the control and power supply portion 43 and the compressed air supply source 44 is cut off.

That is, the paste transfer unit 7 configured thus is provided with the unit side connection portion 41 which is connected to the base side connection portion 42 provided in the feeder base 16 to transmit a control signal or to supply motive power. In this manner, by a simple operation of mounting the paste transfer unit 7 onto the feeder base 16, transmission of the control signal and supply of drive electric power from the control and power supply portion 43 to the control and drive unit 45 can be performed without any separate connection work, and drive compressed air can be supplied from the compressed air supply source 44 to the control and drive unit 45.

Figure 6:
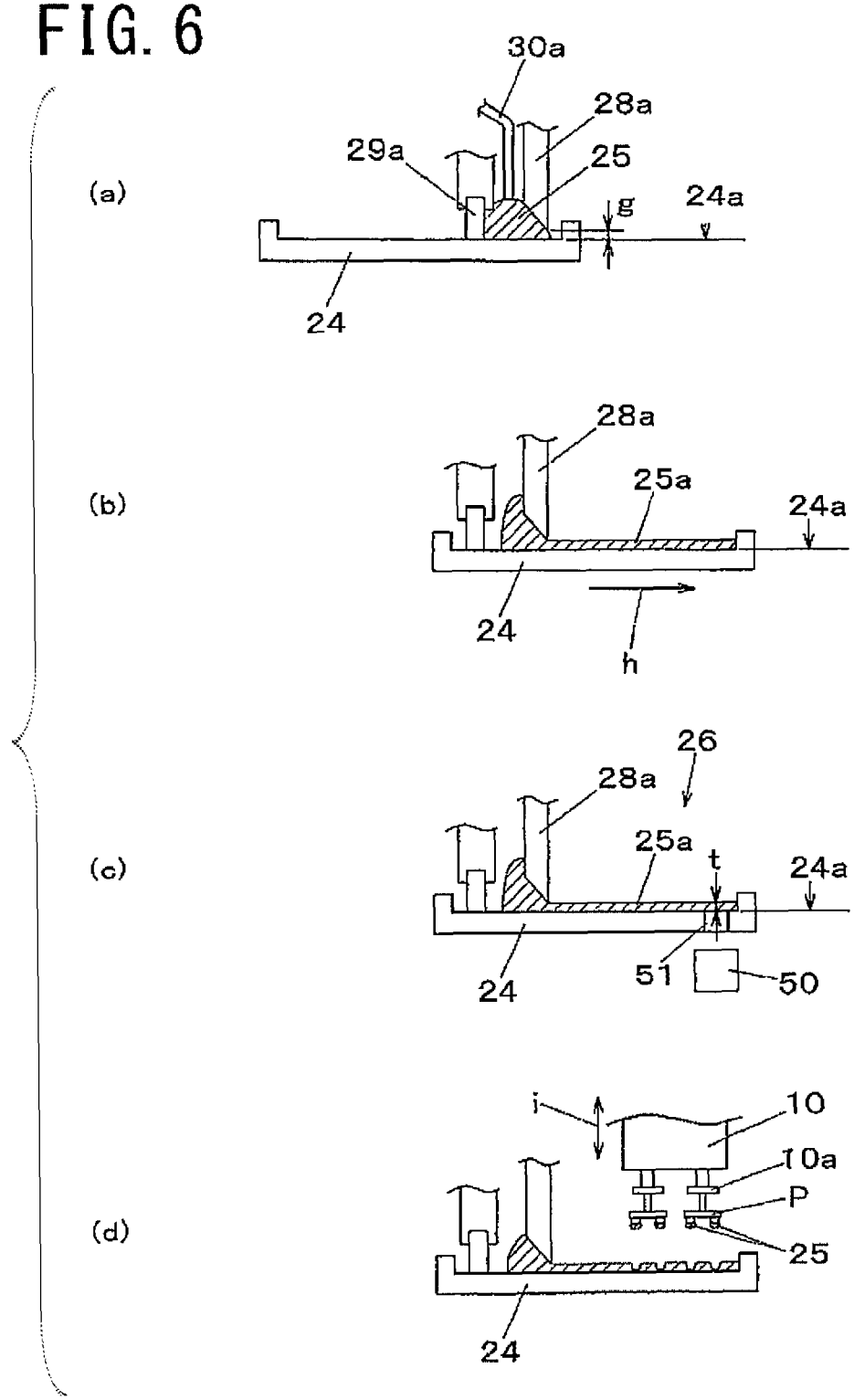
FIGS. 6 (a), (b), (c) and (d) are explanatory views of a transferred film thickness measuring method in the paste transfer unit according to the embodiment of the present invention.

Next, a film formation operation and a scraping operation performed by the paste transfer unit 7 will be described with reference to FIG. 6 (a) to FIG. 6 (d). First, FIG. 6 (a) shows a state in which the transfer stage 24 has been in a retreat position, and the squeegee 28a and the scraper 29a have been located in a film formation start side end portion (right end portion in this example) in the coating film formation surface 24a and the flux 25 has been supplied between the squeegee 28a and the scraper 29a through the needle 30a before the start of the film formation operation. The film-formation-gap g between the lower end portion of the squeegee 28a and the coating film formation surface 24a is set at a predetermined film thickness which is proper for transferring the flux 25 to bumps of electronic components P when the film formation operation is started.

Then, a stage moving unit is driven to move the transfer stage 24 forward (arrow h), as shown in FIG. 6(b). In this manner, the flux 25 is spread on the coating film formation surface 24a by the squeegee 28a and a coating film 25a with a predetermined film thickness is therefore formed on the coating film formation surface 24a. Then, the film thickness in the transfer area 26 is measured. That is, as shown in FIG. 6(c), inspection light is made incident on the coating film 25a through the light-transmitting member 51 by the film thickness measuring unit 50 so that the film thickness t of the coating film 25a can be measured by the measurement processing portion 52 (FIG. 4(b)).

Here, when the measurement result is within a specified range, the mounting head 10 having the nozzles 10a holding electronic components P is moved above the transfer stage 24 and the nozzles 10a are moved up and down (arrow i) here to perform a transfer operation, as shown in FIG. 6(d). In this manner, the flux 25 can be transferred to the bumps of the electronic components P so that the bumps of the electronic components P can be coated with the flux 25. On the other hand, when the measurement result is out of the specified range, a process of adjusting the film-formation-gap g is performed based on the measurement result.

Then, the scraping operation of the flux 25 is performed. That is, in the state in which the squeegee 28a has been moved up, the transfer stage 24 is retreated. Thus, the flux 25 existing on the coating film formation surface 24a is scraped to one side by the scraper 29a so as to return to the state shown in FIG. 6(a). Then, the film formation operation and the scraping operation are performed repeatedly in the same manner. In this process, the film thickness of the coating film 25a in the transfer area 26 is always measured so that proper film thickness management can be performed. Accordingly, a proper transfer amount for the flux 25 can be secured for mounting the electronic components P.

As described above, according to a transferred film thickness measuring method in the paste transfer unit 7 and the electronic component mounting device 1 shown in the embodiment, to measure the film thickness of a coating film of the flux 25 formed on the transfer stage 24 of the paste transfer unit 7, the film thickness of the coating film 25a in the transfer area 26 is measured through the light-transmitting member 51 by the optical type film thickness measuring sensor 53 arranged below the transfer stage 24. In this manner, even when a light-transmissible material such as the light-transmissible flux 25 which has a viscosity characteristic easy to lose its shape and from which an accurate measurement result cannot be obtained easily by a typical film thickness measuring method is used as the bonding paste to be transferred, the film thickness in the transfer area where transfer is practically performed can be measured automatically and accurately without requiring any complicated measurement work.

The present application is based on Japanese Patent Application No. 2012-284186 filed on Dec. 27, 2012, the contents of which are incorporated herein by reference.

INDUSTRIAL APPLICABILITY

The paste transfer unit, the electronic component mounting device and the film thickness measuring method according to the present invention have an effect that the thickness of a film of a paste in the transfer area can be measured automatically and accurately without requiring any complicated measurement work. Accordingly, the paste transfer unit, the electronic component mounting device and the film thickness measuring method according to the present invention are useful in a field where electronic components to which a paste is necessarily supplied before mounting are mounted on a substrate.

REFERENCE SIGNS LIST 1 electronic component mounting device
3 substrate
4A, 4B component feeding portion
6 tape feeder
7 paste transfer unit
10 mounting head
24 transfer stage
24a coating film formation surface
25 flux (bonding paste)
26 transfer area
50 film thickness measuring unit
52 measurement processing portion
53 optical type film thickness measuring sensor
54 optical prism
P electronic component

The invention claimed is:

1. A paste transfer unit which is used for transferring a light-transmissible bonding paste to a solder bump in an electronic component mounting device which mounts, on a substrate, an electronic component having a lower surface on which the solder bump is formed, the paste transfer unit comprising:
 a transfer stage to which the bonding paste is supplied and in which at least a part of a transfer area is made of a light-transmitting member, the transfer area being configured to transfer the bonding paste as a result of solder bump moving;
 a squeegee which is arranged above the transfer stage to have a predetermined film-formation-gap from a coating film formation surface on the transfer stage and which moves relatively and horizontally to the transfer stage to thereby form the supplied bonding paste into a coating film with a predetermined film thickness; and
 an optical type film thickness measuring sensor which is arranged below the transfer stage and which measures the film thickness of the coating film in the transfer area through the light-transmitting member.

2. The paste transfer unit according to claim 1, wherein the light-transmitting member is made of a material having an optical characteristic with a higher light refractive index than a light refractive of the bonding paste.

3. The paste transfer unit according to claim 1, further comprising: a gap adjusting portion which adjusts the film-formation-gap based on a measurement result of the film thickness measured by the optical type film thickness measuring sensor.

4. The paste transfer unit according to claim 1, wherein the optical type film thickness measuring sensor measures the film thickness through an optical prism arranged below the light-transmitting member.

5. An electronic component mounting device which causes a mounting head to pick up an electronic component from a component feeding portion and carry and mount the electronic component onto a substrate, the electronic component having a lower surface on which a solder bump is formed, the electronic component mounting device comprising:

a paste transfer unit which is used for transferring a light-transmissible bonding paste to the solder bump on the electronic component held by the mounting head; and a head moving unit which moves the mounting head to make the mounting head move toward the substrate and the paste transfer unit; wherein the paste transfer unit is the paste transfer unit according to claim 1.

6. A transferred film thickness measuring method which measures a film thickness of a coating film of a light-transmissible bonding paste formed on a transfer stage of a paste transfer unit used for transferring the bonding paste to a solder bump in an electronic component mounting device which mounts on a substrate, an electronic component having a lower surface on which the solder bump is formed, wherein the film thickness of the coating film in a transfer area is measured through a light-transmitting member by an optical type film thickness measuring sensor which is arranged below the transfer stage, the light-transmitting member being formed in at least a part of the transfer area, the transfer area being configured to transfer the bonding paste as a result of solder bump moving.

* * * * *